United States Patent
Rothkegel (10) Patent No.: US 9,862,065 B2
(45) Date of Patent: Jan. 9, 2018

(54) AIR-CUSHIONED SUPPORTING ELEMENT, IN PARTICULAR FOR MOTOR VEHICLES

(71) Applicant: HERRMANN WERKSTATT-TECHNIK GmbH, Poesing (DE)

(72) Inventor: Roland Rothkegel, Berlin (DE)

(73) Assignee: Herrmann Werkstatt-Technik GmbH (DE)

(*) Notice: Subject to any disclaimer, the term of this patent is extended or adjusted under 35 U.S.C. 154(b) by 69 days.

(21) Appl. No.: 14/595,532

(22) Filed: Jan. 13, 2015

(65) Prior Publication Data

US 2015/0197221 A1    Jul. 16, 2015

(30) Foreign Application Priority Data

Jan. 14, 2014  (DE) .................. 10 2014 100 351

(51) Int. Cl.
| | | |
|---|---|---|
| B23Q 3/18 | (2006.01) | |
| B23Q 1/38 | (2006.01) | |
| B25B 11/00 | (2006.01) | |
| H01L 21/683 | (2006.01) | |
| H01L 21/687 | (2006.01) | |

(52) U.S. Cl.
CPC ............. B23Q 3/18 (2013.01); B23Q 1/38 (2013.01); H01L 21/6838 (2013.01); B25B 11/005 (2013.01); H01L 21/6875 (2013.01)

(58) Field of Classification Search
CPC .. B60S 11/00; B23Q 3/18; B23Q 1/38; H01L 21/67092; H01L 21/67115
See application file for complete search history.

(56) References Cited

U.S. PATENT DOCUMENTS

| | | | | | |
|---|---|---|---|---|---|
| 2,572,640 | A | * | 10/1951 | Lovegrove ............. | G03B 27/60 137/556 |
| 2,877,538 | A | * | 3/1959 | Coulon ................... | B23Q 1/38 269/20 |
| 3,208,270 | A | * | 9/1965 | Hill ......................... | G01M 7/04 408/72 R |
| 5,180,000 | A | * | 1/1993 | Wagner ............... | H01L 21/6838 118/725 |
| 5,471,279 | A | * | 11/1995 | Takizawa ............ | H01L 21/6875 269/21 |
| 5,918,362 | A | * | 7/1999 | Yamashita ......... | H05K 13/0069 269/21 |

(Continued)

*Primary Examiner* — Monica Carter
*Assistant Examiner* — Seahee Yoon
(74) *Attorney, Agent, or Firm* — Stevens & Showalter, LLP (57) ABSTRACT

A support device (1) for supporting motor vehicles, with two plate-like bodies, wherein one of these plate-like bodies is a base plate (2) and the other of these plate-like bodies is a support plate (4) capable of being laid on this base plate (2), wherein the base plate (2) has a first even surface (2a) which is opposite a second even surface (4a) of the support plate (4) and wherein the support plate (4) has a support face (4b) for supporting the motor vehicle. According to the invention the support device (1) has a separation device (6, 62, 32, 34) which at least for a time generates a force which acts between the base plate (2) and the support plate (4) and which holds the support plate (4) in a hovering state above the base plate (2), in which hovering state, in particular, the first even surface (2a) and the second even surface (4a) do not touch each other.

14 Claims, 3 Drawing Sheets

(56) References Cited

U.S. PATENT DOCUMENTS

| | | | | |
|---|---|---|---|---|
| 6,073,681 A * | 6/2000 | Getchel | ............... | H01L 21/6838 118/728 |
| 6,257,564 B1 * | 7/2001 | Avneri | ................ | H01L 21/6838 269/21 |
| 7,282,096 B2 * | 10/2007 | Strauch | ............. | H01L 21/68785 118/500 |
| 7,607,647 B2 * | 10/2009 | Zhao | ................... | H01L 21/6838 269/20 |
| 8,616,539 B2 * | 12/2013 | Tseng | ................. | H01L 21/6838 269/21 |
| 2003/0001103 A1 * | 1/2003 | Kobayashi | ............ | B25B 11/005 250/440.11 |
| 2005/0058775 A1 * | 3/2005 | Oku | ................... | H01L 21/6715 427/240 |
| 2006/0054774 A1 * | 3/2006 | Yassour | ............ | H01L 21/67784 248/631 |
| 2007/0236854 A1 * | 10/2007 | Lee | ..................... | G03F 7/70716 361/143 |
| 2010/0132614 A1 * | 6/2010 | Kato | .................... | C23C 16/402 118/723 R |
| 2013/0161889 A1 * | 6/2013 | Risch | ....................... | B23Q 3/00 269/35 |
| 2014/0263935 A1 * | 9/2014 | Coster | ....................... | B66F 1/06 248/676 |

* cited by examiner

AIR-CUSHIONED SUPPORTING ELEMENT, IN PARTICULAR FOR MOTOR VEHICLES

The present invention relates to a supporting element, or a support device respectively, for motor vehicles. Supporting elements of this type can be used for example in lifting stages, and they are used in this case in order to carry components of the motor vehicle, in the present case in particular for supporting the tyres.

Modern vehicles require precisely set chassis. The higher the quality and the greater the performance of the vehicles, the greater the demand set upon the precision of the chassis and therefore also upon the vehicle measurement technology. The aim of the invention described below is to increase significantly this precision and the comfort in the axle measurement.

The adjustment of these chassis (toe, wheel camber, trailing, king-pin inclination, axle offset, wheel offset, toe motion, . . . etc.) is carried out at present in the factory and in servicing workshops by means of complex optical axle measurement systems, i.e. as a rule computer-controlled optical measurement systems with 3-D video cameras or measuring lasers. At the measurement station for the chassis measurement, high demands are set with respect to the evenness in order to ensure that the vehicle is situated on an ideal plane (normal surface). As a rule, the measurement station used is in the form of so-called chassis measurement lifting stages, which independently of the position of the vehicle and of the height position of the stage guarantee the necessary tyre contact area (normal surface), in the scope of the pre-set tolerances of the automobile industry. Manufacturers of premium class vehicles meanwhile require degrees of accuracy of evenness of the contact areas of the individual wheels to one another of +/−0.5 mm, which is close to the economically and technically feasible limit.

A further crucial pre-condition for a precise axle measurement is that the chassis have to be preferably totally released in the plane, despite considerable wheel loads. During the rolling of a vehicle individual wheels/axles are constantly stressed by driving, rolling and braking resistance as well as the toe conditions of the wheels/axles. In order to eliminate this effect which is damaging for the measurement, the wheels are placed on so-called rotation/sliding plates which are intended to overcome the stressing of the wheels in the plane (longitudinally and transversely). The lower the friction of these rotation sliding plates, the more precisely the measurement of the axles of the vehicle can be carried out.

The manufacturers of premium class vehicles strive to allow only 15 N sliding force (=friction) in the case of rotation/sliding plates at a wheel load of an assumed maximum of 5,000 N. Commercially available rotation sliding plates do not allow this. The established technical solution for rotation/sliding plates of this type are plate systems with a standard height of 50 mm which are laid on the measurement plane or are embedded in the carriageway plane of the lifting stage by precisely these 50 mm (recesses). For this latter reason it is necessary, even in the case of novel innovative solutions such as the one described below, to produce a system which could make do with a standard system height of only 50 mm.

Rotation/sliding plates have to be capable of allowing both translational movements in the plane (x, y) and rotational movements about the vertical axis and in this case obtaining the plane precision of the tyre contact area. In addition, this freedom of movement has to be capable of being blocked by a fixing device in order to drive up a vehicle in a safe and precise manner and to be capable of using this blocking or release in a purposeful manner during the measurement.

Known technical solutions operate with ball systems. In this case ball clusters (plastics material or steel) are used between a base plate and a top plate in order that the top plate can slide with respect to the base plate even under load. The fixing of the freedom of movement is usually carried out by way of manual fixing pins or clamping devices activated by actuating cylinders.

Ball systems of this type which are known in the prior art have the drawback, however, that they have a very high degree of friction, in particular in the case of soiling. Furthermore, the distance faces usually have a relatively low degree of precision since the structural height of the ball clusters allows only an inadequate thickness (in the range of front 6 to 15 mm) of the top plate. In addition, fixing devices in these apparatus are also very complicated.

The object of the present invention is therefore to make supporting elements of this type more precise, in particular even with the load capacity unchanged or even improved. These objects are attained according to the invention by the subject matter of the independent claim. Advantageous embodiments and further developments form the subject matter of the sub-claims.

A support device according to the invention, in particular for supporting motor vehicles, has two plate-shaped bodies, one of these plate-shaped bodies being a base plate and the other of these plate-like bodies being a support plate capable of being laid on this base plate. Furthermore, the base plate has a first even surface which is opposite a second even surface of the support place and, furthermore, the support plate has a support face for supporting the motor vehicle.

According to the invention the support device has a separation device which at least for a time generates a force which acts between the base plate and the support plate and which holds the support plate in a hovering state above the base plate, in which, in particular, the first even surface and the second even surface do not touch each other.

In contrast to the prior art it is thus proposed that a distance is produced between the base plate on the one hand and the support plate on the other hand, in particular while the latter carries the vehicle, so that the support plate in particular hovers above the base plate. On account of this situation, measurements to be carried our are facilitated to a considerable degree and nevertheless a highly uniform lifting is possible, in particular even if the support plate is not loaded exactly centrally. It is preferable for the vehicle or regions thereof which are to be investigated to be supported at least for a time by the support plate.

In the case of a preferred embodiment the force mentioned above is selected from a group of forces which includes hydraulic forces, pneumatic forces and magnetic forces. A pneumatic force is understood in this case to be a force produced by a gaseous medium, and in particular by air. In particular, this is a force which is formed by the gaseous medium being introduced between the base plate and the support plate. In a corresponding manner, a hydraulic force is a force produced by a liquid medium.

It is advantageous for the device to have a gas supply device in order to supply a gaseous medium to at least one of the two plate-like bodies, a channel which is connected in terms of flow to the gas supply device being provided in at least one of these plate-like bodies, and at least one gas outlet opening by way of which the gas can escape from an even surface being provided at least in this surface in order to force the base plate and the support plate apart from each other.

In contrast to apparatus known from the prior art, it is proposed here that air should be used for lifting the support plate. In this way, an air-cushioned mounting, and in particular an air-cushioned mounting without friction, is proposed. In other words, within the scope of this embodiment an air-cushioned mounting without friction is proposed which operates in this case by way of an air gap and/or by way of a magnetic coupling.

A supporting layer of air is present between the base plate and the support plate. This supporting layer of air can be fed by compressed air, which in turn is supplied to the apparatus by way of the gas supply device mentioned above. In this way, the support plate can hover slightly above the base plate on account of this compressed air, for example at a height of a few hundredths of a millimeter. In this way, a hovering of the support plate without contact or friction is possible. In this case the gaseous medium or the air respectively forces the support, plate and the base plate apart from each other in this way. Instead of a gaseous medium it would also be possible for a liquid medium to be used. In the case of this embodiment the means for introducing the gaseous medium between the base plate and the support plate constitute the separation device or hovering-state attainment device respectively mentioned above.

In the case of a further advantageous embodiment a magnetic element is provided in at least one of the plate-like bodies, in order to produce a magnetic field between the plate-like bodies, which forces the plate-like bodies apart from each other. In the case of this embodiment the support device operates in accordance with the principle of a magnetic levitation train. In this case one or more permanent magnets could be incorporated for example in one of these plate-like bodies and electromagnets in the other plate-like body. If these have current passed through them in such a way that the same poles of these electromagnets and of the permanent magnet are opposite one another, a repulsion of the support plates from the base plate will occur and thus a hovering of the support plate with respect to the base plate. In the case of this embodiment the magnetic components constitute in their entirety the separation device or hovering-state attainment device respectively mentioned above.

It would also be possible, however, for permanent magnets to be provided in the two plate-like bodies, in which case a relative position of these permanent magnets with respect to each other can be changed. In this way, as a result of a change in the relative position in this way for example a distance of the opposite polarities can be reduced, in order to force the two plate-like bodies apart from each other.

It is preferable for the permanent magnet to have a cylindrical cross-section, this cross-section preferably extending in one of the two even surfaces. In this way, it is possible for the force acting between the plate-like bodies to be capable of being retained even during a rotation of one plate-like body with respect to the other plate-like body. In addition, the respective magnets can be arranged in such a way that displacements of the plate-like bodies with respect to each other are possible while retaining the hovering state of the support plate.

In the case of this embodiment according to the invention the device has at least one first magnetic or magnetizable element which is arranged in one of the two plates and which is opposite a further magnetic element which is arranged in the other of the two plates. In this case it is preferable for one of these magnetic elements to be an electromagnet which can be magnetized in different directions. It is preferable for the other magnetic element to be a permanent magnet. In this way, a raising of the support plate can be achieved by the corresponding magnetic forces.

It is advantageous in this case for the first magnetic element to be designed in the form of a magnetizable ring and the second magnetic element is also preferably designed in the form of a ring of this type. Through corresponding magnetizing of these ring and/or of the magnets the two plates can be forced apart from each other. It would also be possible, however, for an annular permanent magnet of this type to have opposite it a plurality of electromagnets (preferably at least three) which, however, are arranged along this annular shape of the permanent magnet.

It is preferred for the aforesaid even faces to be even at least locally. It is preferable, however, for these surfaces to be even at least in those regions in which they are opposite each other.

It is preferable for the support face of the support plate to be used for supporting a component part of a motor vehicle, and in particular a wheel of a motor vehicle.

It is preferable for the gas supply device to be arranged on the support plate and for the gas outlet openings on the support plate also to be provided in a corresponding manner.

It would also be possible, however, for the gas supply to be arranged on the base plate and for the openings on the base plate also to be arranged in a corresponding manner. In addition, it would also be possible for gas supply devices of this type and also gas outlet openings to be provided both on the support plate and on the base plate.

In the case of a further advantageous embodiment the apparatus has a guide device which prevents a displacement of the two plates with respect to each other in a transverse direction, in particular in a horizontal plane. The two plate-like bodies are raised preferably completely one off the other, in particular separated preferably completely from each other, by the air supply mentioned or the magnetic forces respectively.

In the case of a further advantageous embodiment a supporting face for the vehicle wheel is opposite the aforesaid even face. It is preferable for the supporting face to have provided on it anti-slip elements which prevent slipping, in particular of a vehicle wheel. This can be for example, and preferably, effectively gripping surface structures in the contact area. Rubber-like elements on which the motor vehicle rests would also be possible. In this case these rubber-like elements can be formed in the surface of the support plate.

In the case of a further advantageous embodiment a plurality of gas outlet openings are provided in the even surface, these gas outlet openings being connected in terms of flow to the gas supply device. By means of this plurality of gas outlet openings the device can be acted upon uniformly with compressed air and, in this way, the support plate can also be raised in a uniform manner.

It is preferable for a plurality of gas outlet openings to be arranged along a continuous line. In this case these outlet openings can be arranged, in particular, along an annular line. With this embodiment the supporting air-cushioned mounting is designed in the form of an annular face, in order to ensure, in particular, a tilting stability even in the event of an eccentric introduction of force. In this case it is possible for a removal of air to be carried out, starting from this supporting annular face, radially towards the inside and/or radially towards the outside. In addition, it is possible for a first group of gas outlet openings to be arranged along a first continuous (in particular circular) line and for a second group of gas outlet openings to be arranged along a second continuous (in particular circular) line, in which case the first and the second continuous lines have different radii.

In addition, it would also be possible for the gas outlet openings to be arranged in an annular segment. In this way, a movability of the support plate with respect to the base plate can be achieved even in a horizontal plane or that plane in which the air gap extends between the base plate and the support plate, whilst retaining the hovering state, respectively.

In the case of a further advantageous embodiment the support device has a locking element in order to limit a distance between the even surfaces. In this way, it is possible for only a very small distance between the support device and the base plate to be achieved by the stressing with compressed air or also alternatively by the stressing with a magnetic field. In this case a supporting layer of air, which is fed by compressed air, is present between the base plate, which is designed in this case in the form of a precise main plate, and the support plate, which is designed in particular in the form of a rigid plate. This layer of air can be for example a few hundredths of a millimeter in this case and can allow the support plate to hover without contact or friction.

It is advantageous for the introduction of the air and the uniform pressure distribution in the annular face mentioned above to be carried out by way of nozzles which are arranged symmetrically and which preferably have a diameter of less than 1 mm. These can be fed by way of a regulated central air supply at from 1 to 5 bar. It is advantageous for a maximum distance to be capable of being set between the support plate and the base plate. A disc, which is arranged on a recess of the other element in each case or which engages behind the other plate-like element in each case respectively, can be provided for example as a locking element. It is preferable for the base plate to have a recess in which a disc, which in turn is coupled to the support plate, is arranged and, in this way, permits only a maximum distance between the base plate and the support plate.

In the case of a further advantageous embodiment the support device has a guide element or the guide device already mentioned above, which restricts a movement of the support plate with respect to the base plate in at least one direction at a right angle to a distance direction between these two plate-like bodies. It is preferable for this distance direction to extend vertically, so that the direction at a right angle to the distance direction extends preferably horizontally. It is preferable for this guide device to restrict a movement of the support plate with respect to the base plate in at least two directions which are at right angles to the distance direction in each case. It is particularly preferred for the guide device to restrict a movement of the support plate with respect to the base plate in a movement plane which is at a right angle to the aforesaid distance direction.

It is preferable tor the locking device described above also to serve as a guide device, i.e. the locking device serves, in particular, also to restrict a horizontal movement between the support plate and the base plate. In this case a freedom of movement of the two plates with respect to each other can be defined by the cross-sectional ratios between the above-mentioned recess and the disc.

It is preferable for at least one gas outlet opening to have a nozzle element.

In this case at least one nozzle element is advantageous and it is preferable for a plurality of nozzle elements to be capable of being removed from the plate-like body.

In this way, an adaptation to different conditions, for example different masses of the motor vehicles to be lifted, is possible. Instead of nozzles, porous air-permeable materials could also be used in order to introduce the compressed air into the gap between the two plates. As mentioned above, it would also be possible for the aforesaid nozzles to be arranged not in the support plate but in the base plate.

In the case of a further advantageous embodiment an annular channel can be provided which supplies the gas outlet openings with the gaseous medium. This annular channel can be fed centrally for example in this case and, after that, can supply the individual nozzles. In this way, it would be possible for example for this annular channel to extend around the external periphery of the support plate or the base plate respectively. It would also be possible, however, for the air to be supplied centrally to the base plate, in particular, and, after that, to be conveyed by a plurality of radially extending channels to the individual air outlet openings.

In the case of a further preferred embodiment the support plate is rotatable at least for a time with respect to a pre-set axis of rotation relative to the base plate. In this way, steering movements of the vehicle to be tested can also be carried out.

In the case of a further advantageous embodiment the support device has a rotation detection device in order to detect a rotational setting of the support plate with respect to the base plate.

It is usually no longer possible for the measurement of the maximum steering angle to be measured by electronic axle measurement systems by way of the measurement sensors thereof. The measurement of this maximum steering angle can be carried out for example by way of the rotation sliding plate described here. This plate has a rotation detection device, for example in the form of a displaceable graduated scale which is situated on the outside and which can be aligned by means of a mechanical pointer or a laser beam and can be read off at full lock of the steering.

In addition, it would also be possible for an automatic sensing of the angle of rotation to be provided, for example also internally in the base plate, by means of a laser or a suitable sensor. In this way, a suitable scale can be provided for example on the guide disc mentioned above. This is explained in greater detail with reference to the figures.

In the case of a further advantageous embodiment at least one of the gas outlet openings is also capable of being acted upon with a vacuum in order to pull the support plate and the base plate towards each other. It is advantageous, in particular for driving up a vehicle to be measured, for the support device to be capable of being locked or blocked respectively. This is carried out in order to be able to absorb the driving and braking forces which occur. The solutions known in the prior art operate in this case with insertion pins capable of being manually actuated or mechanical clamping devices. Within the context of an advantageous embodiment it is now proposed that this blocking of the two plates should be produced by means of vacuum. Instead of the introduction of compressed air to the plates, the air is sucked away and an (under-)pressure in the range of at least from 0.3 to 0.8 bar, i.e. a vacuum, is formed between the support plate and the base plate. This vacuum presses the plates together with a force which in a manner dependent upon the pressure can reach up to 10,000 newtons. In this way, a stable non-positive locking connection is produced in order to meet all requirements.

In this way, an air-cushioned mounting without friction is proposed within the scope of the invention.

It is preferable for the support device, and in particular the support plate and the base plate, jointly to have a height which is between 30 mm and 70 mm, preferably between 40 mm and 60 mm and in a particularly preferred manner at approximately 50 mm. In this case it is preferable for the base plate to have a lower height than the support plate, for example ⅓ of the total height. This is advantageous in particular if guide channels for the flowable medium are incorporated in the support plate. Conversely, however, it would also be possible for the base plate to have a greater thickness than the support plate.

As mentioned, it is preferable for the plates to have provided between them a supporting layer of air, fed by compressed air, of a few hundredths of a millimeter which allows the top plate or the support plate respectively to hover with contact or friction. The supporting air-cushioned mounting is preferably designed in the form of an annular face in order to ensure tilting stability even in the event of an eccentric introduction of force. The removal of air from the supporting annular face is preferably carried out radially towards the inside and towards the outside.

Even if a magnetic coupling were used, it would be possible, with a suitable polarity of the magnets, for the two plates to be pulled towards each other by magnetic force in such a way that they are blocked with respect to each other. It is preferable, as mentioned above, for the air cushion to be annular for stabilizing the position even in the event of eccentric introductions of force. In addition, on account of the stressing with compressed air, a radial air flow occurs which also ensures a self-cleaning of the support device.

As described above, the air supply is preferably carried out by way of annular and/or radial channels, and/or with nozzles of between 0.5 and 1.0 mm.

In addition, it is preferable for a control device to be provided for the control of the air supply. In this case a controlled activation or deactivation respectively of the air-cushioned mounting of the individual support devices or the fixing thereof can be carried out with the aid of a control means.

The present invention further relates to a system for the support of motor vehicles, which has at least two and preferably at least three, and in a particularly preferred manner at least four, support devices of the type described above.

It is preferable for the system to have a control device which permits a selective activation and/or deactivation of the individual support devices. In this way, when a motor vehicle is driven up for example all the support devices can first be locked and individual support devices or pairs, for example the front or rear support devices, can then be activated.

Further advantages and embodiments are evident from the accompanying drawings. In the drawings

Figure 1:
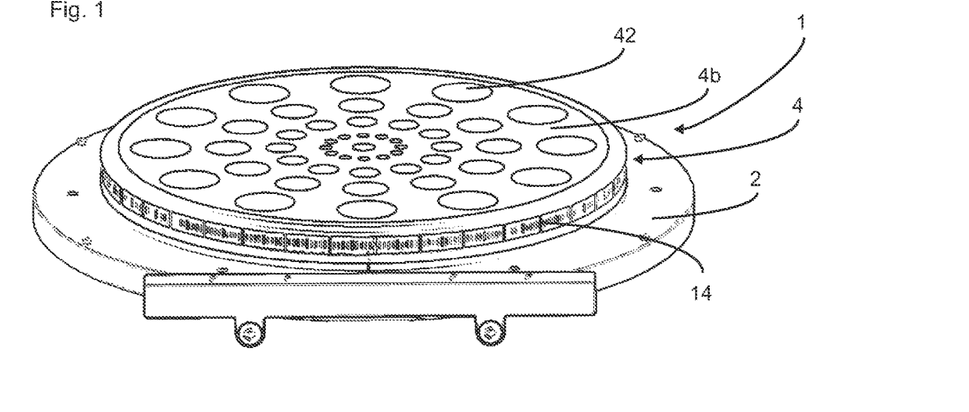
FIG. 1 is an illustration of a support device
according to the invention.

FIG. 1 is an illustration of a support device 1 according to the invention. The latter has a base plate 2 as well as a support plate 4. This support plate 4 can be raised slightly off from the base plate 2 by means of compressed air (or a hydraulic medium) or by being acted upon with a magnetic field. The reference number 4b indicates a supporting face on which the wheel of a motor vehicle for example can be positioned. For this purpose anti-slip elements 42 such as for example rubber elements can be provided which prevent slipping of the vehicle wheel with respect to the surface 4b. The reference number 14 designates a scale which is arranged on the support plate and by which a rotational setting of the support plate 4 with respect to the base plate 2 can be detected.

Figure 2A:
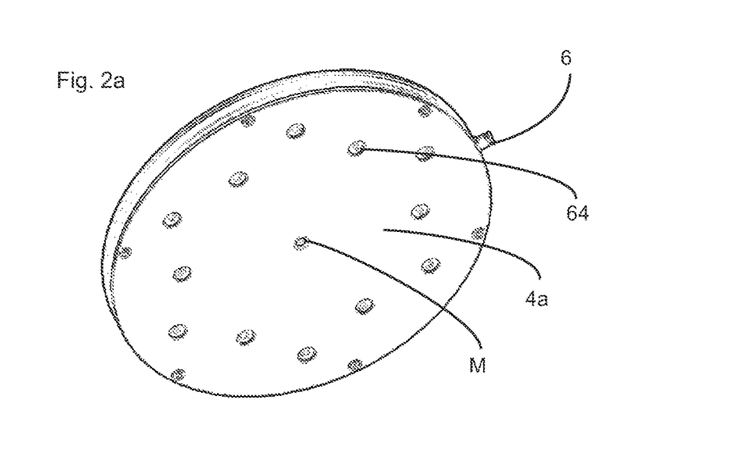
FIG. 2a is an illustration of a support plate.

FIG. 2a is an illustration of the support plate 4. This support plate 4 has in this case a surface 4a which is opposite a corresponding surface 2a of the base plate 2 during operation. A plurality of diverse outlet openings 64 are provided in this surface. In addition, a gas supply device 6 in the form of a connection is provided, by way of which compressed air can be supplied to the support plate 4. This compressed air is pressed out of the support plate by way of the gas outlet openings 64 and produces a slight raising of this support plate in this way.

It will be noted that a distance of the outlet openings 64 from a mid-point M of the support plate varies. In this way, specified movements of the plate-like bodies in the horizontal plane can also be permitted whilst retaining the hovering state.

Figure 2B:
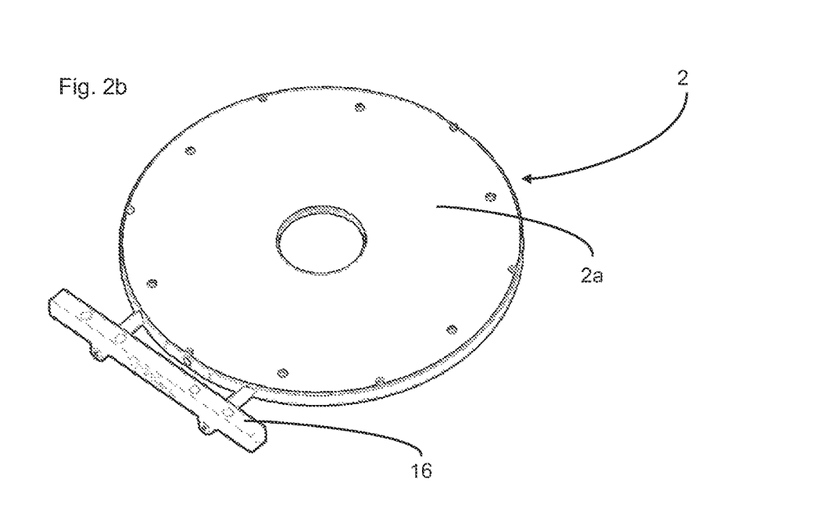
FIG. 2b is an illustration of a base plate.

FIG. 2b is an illustration of the base plate 2. This, too, has an even surface 2a which is opposite the surface 4a during operation. When acted upon with compressed air or a magnetic field the support plate 4 can be raised slightly with respect to the base plate 2.

The reference number 16 indicates a carrier in which a measuring instrument for example can be incorporated. In addition, this device can be provided for carrying the support plate 4. The support plate 4 can in turn be arranged on a carrier (not shown).

Figure 3:
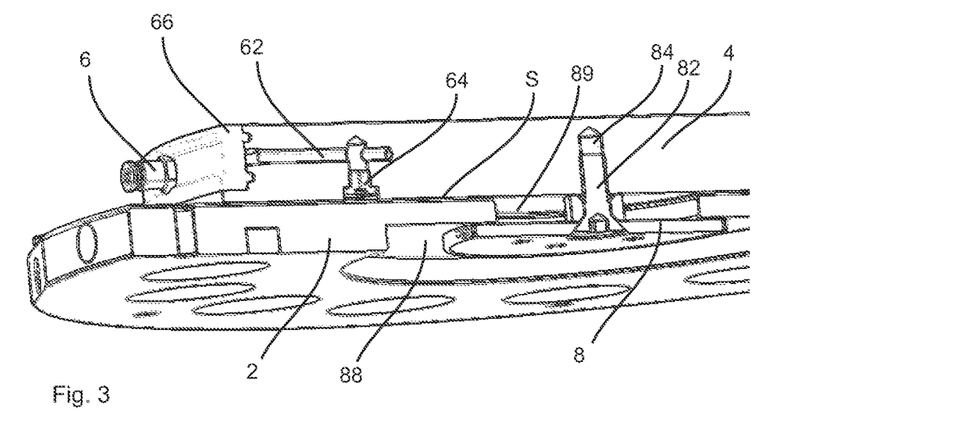
FIG. 3 is a sectional illustration of the support device shown in FIG. 1.

FIG. 3 is a sectional illustration of the support device shown in FIG. 1. In this sectional illustration the base plate 2 and the support plate 4 will in turn be noted. In the interior of the support plate 4 a channel 62 will be noted, by way of which the compressed air is conveyed from the gas supply device 6 to the outlet opening 64. In this case it is possible for the gas supply device 6 to be arranged on a distribution device 66 which in turn is designed like an annular channel and supplies a plurality of the lines 62 with the compressed air. In this way, a uniform supply of the gas outlet openings 64 with the compressed air is possible. The gas outlet openings are designed in this case in the form of nozzles which are capable of being inserted into the support plate. In particular, these are nozzles of plastics material.

It would also be possible, however, for magnetic elements, which allow a spacing with a suitable flow of current, to be arranged in the support plate 4 or the base plate 2.

The reference number 8 designates a locking device which allows a lifting of the support plate 4 with respect to the base plate 2 to only a limited degree. This can be a disc which is fastened on one side to the support plate by way of a connecting device 82 but which is situated on the other side in a recess 88 in the base plate 2 and can strike against the base plate 2. In this case the connecting device 82 is arranged in a recess 84 or a bore 84 respectively in the support plate, so that the setting can be changed. If the gap S between the support plate 4 and the base plate 2 is now acted upon with compressed air or with a magnetic field, the support plate is raised only to the degree that the locking device strikes against the base plane. In this way, the raising of the support plate 4 with respect to the base plate 2 can be restricted. In this way, a highly efficient raising is also possible, since the maximum gap width can be limited in a simple manner.

This locking device also performs the function of a guide device in this case. As shown in the figure, the cross-sections of the disc 8 and the recess 88 differ. This means that the disc has a certain freedom of movement with respect to the recess in the horizontal plane. Since the disc 8 is coupled in turn to the support plate, the support plate is also movable with respect to the base plate in a pre-determined range in the movement plane (in this case horizontal). In the case of the embodiment shown here, the movement is the same in all directions of movement starting from a central arrangement of the support plate with respect to the base plate, since preferably both the disc 8 and the recess 88 have a circular profile in each case. This could also be changed, however, and, in this way, a greater degree of clearance could be permitted for example in the direction of travel of a vehicle than in a direction at a right angle to it.

The reference number 89 designates a further opening in the base plate, through which the connecting device 82 extends. In addition, the size ratios between this opening and the connecting device 82 are selected in such a way that a clearance between the support plate 4 and the base plate 2 is made possible. On the other hand, however, this opening 89 has a smaller cross-section that the disc or the locking device respectively, so that the disc cannot pass through the opening.

Figure 4A:
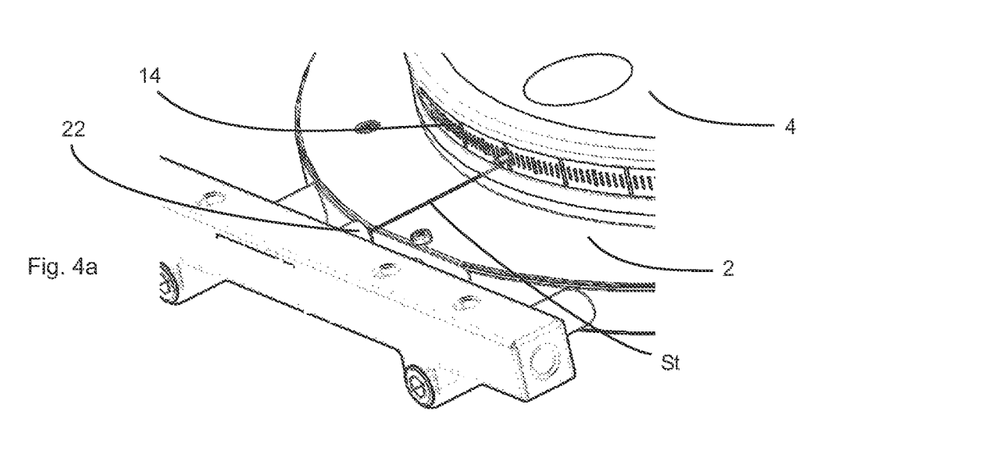
FIG. 4a is an illustration to explain the measurement of an angle of rotation.

FIG. 4a is a further illustration of an apparatus according to the invention. In this case the measuring scale 14 is again provided which can be scanned by a laser 22 by means of a beam ST. In this way, a relative rotational setting of the support plate 4 with respect to the base plate 2 can be determined.

Figure 4B:
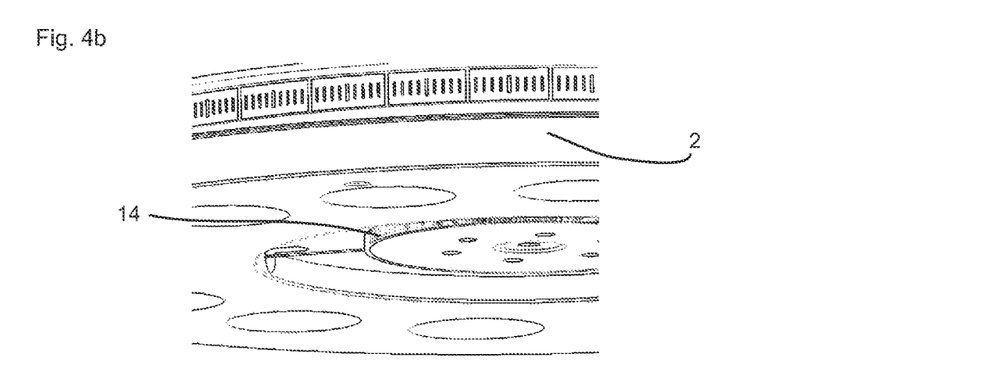
FIG. 4b is a further illustration to explain the measurement of an angle of rotation, and FIGS. 5a, b are an illustration of a support device in a further embodiment.

In the case of the variant shown in FIG. 4b this corresponding measuring instrument is arranged on the inside and a corresponding scale is arranged on the locking device 8 thereof. A laser can be incorporated in the support plate 4 for example in this case.

Figure 5A:
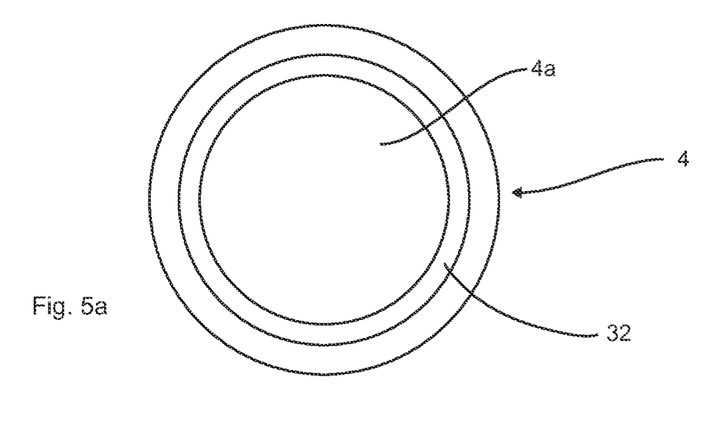
Figure 5B:
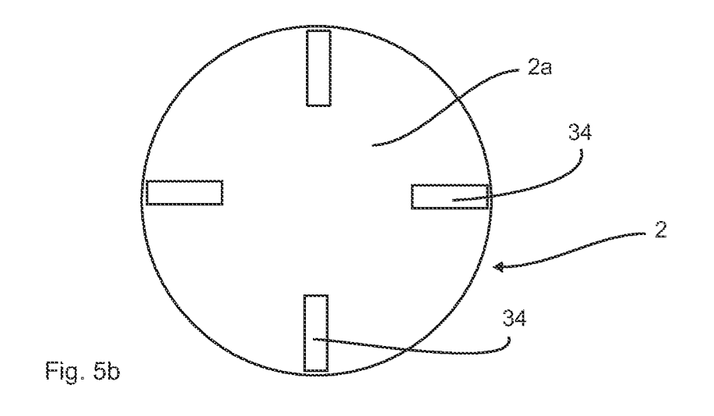

FIGS. 5a and 5b show a further embodiment of a support device according to the invention. In this case the hovering state is effected by magnetic forces. For this purpose the support plate has a permanent magnet 32 which in this case has an annular cross-section (cf. FIG. 5a). This electromagnet can be polarized in such a way in this case that the magnetic north pole thereof is situated in a continuous manner on the surface 4a for example.

Four electromagnets 34 are incorporated in the base plate 2 in this case. These electromagnets can have current pass through them in such a way that they likewise form a magnetic north pole in each case on the surface 2a. In this case a hovering state of the support plate 4 above the base plate 2 can be achieved. If, on the other hand, the electromagnets 34 have current pass through them in such a way that they have a magnetic south pole in the surface 2a, then the two plates are pulled towards each other and can be locked with respect to the rotational setting in this way.

As shown in FIG. 5b, the electromagnets have in each case a rectangular cross-section in this case, the longer side of these rectangles being substantially larger than an annular width of the magnetic ring 32. In this way, it is possible for the support plate 4 not only to be capable of being rotated with respect to the base plate, but also in the horizontal plane or—in the illustration given—capable of being moved in the plane of the figure respectively, without departing from the hovering state in this respect.

The Applicants reserve the right to claim all the features disclosed in the application documents as being essential to the invention, insofar as they are novel either individually or in combination as compared with the prior art.

LIST OF REFERENCES 1 support device
2 base plate
2a surface
4 support plate
4a surface
4b supporting face
6 gas supply device
8 locking device
14 scale
16 carrier
22 laser
32 permanent magnet
34 electromagnets
42 anti-slip elements
62 channel
64 outlet openings
66 distribution device
82 connecting device
84 recess/bore
88 recess
89 opening
S gap
ST beam

The invention claimed is:

1. A support device (1) for supporting motor vehicles, with two plate-like bodies, wherein one of the plate-like bodies is a base plate (2) and the other of the plate-like bodies is a support plate (4) capable of being laid on the base plate (2), wherein the base plate (2) has a first even surface (2a) which is opposite a second even surface (4a) of the support plate (4) and wherein the support plate (4) has a support face (4b) for supporting the motor vehicle, wherein the support device (1) has a separation device (6, 62, 32, 34) which at least for a time generates a force which acts between the base plate (2) and the support plate (4) and which holds the support plate (4) in a hovering state above the base plate (2), in which hovering state the first even surface (2a) and the second even surface (4a) do not touch each other, and wherein a plurality of one gas outlet openings (64) each have a nozzle element (66) that is removable from at least one of the plate-like bodies (2, 4) and has a diameter of less than 1 mm, the nozzle element being inserted in the at least one plate-like body (2, 4) and communicating with the respective gas outlet opening (64), and wherein the plurality of gas outlet openings (64) is arranged along an annular line so that the nozzle elements (66) are arranged symmetrically and the support device is designed in the form of an annular face and the introduction of air and a uniform pressure distribution in the annular face is carried out by way of the nozzles elements (66).

2. The support device (1) according to claim 1, wherein the force is selected from a group of forces which includes hydraulic forces, pneumatic forces and magnetic forces.

3. The support device (1) according to claim 1, wherein the plurality of gas outlet openings (64) is provided in the second even surface (4a), and wherein the plurality of gas outlet openings are connected in terms of flow to the gas supply device (6).

4. The support device (1) according to claim 1, wherein the support device (1) has a locking element (8) in order to limit a distance between the first and second even surfaces.

5. The support device (1) according to claim 1, wherein the support device (1) has a guide element (8) which restricts a movement of the support plate (4) with respect to the base plate (2) in a direction at a right angle to a distance direction between the two plate-like bodies.

6. The support device (1) according to claim 1, wherein the support plate (4) is rotatable at least for a time with respect to a pre-set axis of rotation relative to the base plate (2).

7. The support device (1) according to claim 1, wherein the plurality of gas outlet openings is capable of being acted upon with a vacuum in order to fix the plate-like bodies (2, 4) with respect to each other.

8. The support device (1) according to claim 1, wherein a magnetic element is provided in at least one of the plate-like bodies (2, 4), in order to produce a magnetic field between the plate-like bodies (2, 4), which forces the plate-like bodies apart from each other.

9. The support device (1) according to claim 3, wherein the plurality of gas outlet openings are arranged along a continuous line.

10. The support device (1) according to claim 1, wherein the support face (4b) includes anti-slip elements that prevent slipping of a wheel of a vehicle supported on the support device.

11. The support device (1) according to claim 10, wherein the anti-slip elements comprise at least one of: gripping surface structures in a tyre contact area with the supported vehicle; and rubber-like elements on which the supported vehicle rests.

12. The support device (1) according to claim 10, wherein the anti-slip elements comprise rubber-like elements on which the supported vehicle rests, the rubber-like elements being formed in the support face (4b).

13. The support device (1) according to claim 1, wherein the gas outlet opening (64) has a circular shape.

14. The support device (1) according to claim 1, wherein the support face (4b) includes anti-slip elements that prevent slipping of a wheel of a vehicle supported on the support device, the anti-slip elements comprising at least one of: gripping surface structures in a tyre contact area with the supported vehicle; and rubber-like elements on which the supported vehicle rests, the rubber-like elements being formed in the support face (4b).

* * * * *